United States Patent
Mun et al.

(10) Patent No.: US 7,877,077 B2
(45) Date of Patent: Jan. 25, 2011

(54) MULTI-BAND LOW NOISE AMPLIFIER AND MULTI-BAND RADIO FREQUENCY RECEIVER INCLUDING THE SAME

(75) Inventors: Hyun-Won Mun, Gyeonggi-do (KR); Seong-Han Ryu, Gyeonggi-do (KR); Il-Ku Nam, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 668 days.

(21) Appl. No.: 11/873,484

(22) Filed: Oct. 17, 2007

(65) Prior Publication Data
US 2008/0096516 A1   Apr. 24, 2008

(30) Foreign Application Priority Data
Oct. 17, 2006   (KR) .................... 10-2006-0100632

(51) Int. Cl.
*H04B 1/16* (2006.01)

(52) U.S. Cl. ................. 455/341; 455/168.1; 455/253.2; 455/280; 455/286; 330/10; 330/286

(58) Field of Classification Search ................. 455/341, 455/168.1, 253.2, 280, 286; 330/10, 286
See application file for complete search history.

(56) References Cited

U.S. PATENT DOCUMENTS

| 4,311,966 A | * | 1/1982 | Bert et al. | .................... 330/286 |
| 5,412,339 A | * | 5/1995 | Takano | ........................ 330/54 |
| 2007/0152747 A1 | * | 7/2007 | Smith et al. | .................. 330/10 |

FOREIGN PATENT DOCUMENTS

| JP | 2003-283263 | 10/2003 |
| JP | 2004-266356 | 9/2004 |
| KR | 0544958 | 1/2006 |

* cited by examiner

*Primary Examiner*—Sanh D Phu
(74) *Attorney, Agent, or Firm*—Volentine & Whitt, P.L.L.C.

(57) ABSTRACT

A multi-band low noise amplifier (LNA) includes multiple low noise amplifying circuits configured to selectively operate in corresponding frequency bands. The low noise amplifying circuits include corresponding amplifying units and degenerating units. The degenerating units include first inductors, which are arranged in loop patterns isolated from each other on a same layer, such that one first inductor surrounds at least one other first inductor. A current flows through a selected first inductor included in a selected low noise amplifying circuit of the low noise amplifying circuits.

18 Claims, 8 Drawing Sheets

MULTI-BAND LOW NOISE AMPLIFIER AND MULTI-BAND RADIO FREQUENCY RECEIVER INCLUDING THE SAME

CROSS-REFERENCE TO RELATED APPLICATIONS

A claim of priority is made to Korean Patent Application No. 10-2006-0100632, filed on Oct. 17, 2006, the subject matter of which is hereby incorporated by reference.

BACKGROUND OF THE INVENTION

1. Field of the Invention

The present invention relates to wireless communications, and more particularly to a multi-band low noise amplifier (LNA) and a radio frequency (RF) receiver including the multi-band LNA.

2. Description of the Related Art

Mobile communication equipment, such as cellular phones, personal digital assistants, mobile personal computer terminals, etc., have become widely used as advancements have been made in mobile communication systems. Mobile communication systems may be capable of transmitting/receiving signals in various frequency bands, such as 800 MHz to 1.0 GHz, 1.5 GHz to 2.0 GHz, etc.

Components of mobile communication equipment must be miniaturized and have enhanced performance characteristics. Demand for reducing the size and manufacturing costs of mobile communication equipment is ever increasing. Additionally, studies for reducing the size and manufacturing costs of the components have been actively conducted.

A conventional integrated inductor is an important passive device used for impedance matching in an integrated circuit. The conventional integrated inductor typically occupies the largest circuit area in an integrated circuit. Because impedance varies depending on frequency, and the size of an inductor increases as frequency decreases. The manufacturing cost also increases as the size of the integrated circuit increases. Accordingly, various efforts have been made to develop integrated inductors that are relatively small in size, but that maintain high impedance characteristics and high quality factors.

An RF transceiver supports multi-bands and multi-modes, and recent RF transceivers require a form factor having a smaller size due to miniaturization of mobile communication equipment, such as cellular phones. However, supporting multi-bands and multi-modes in smaller mobile communication equipment is very difficult. Additionally, insufficient circuit area may be a concern in integrated circuit design, particularly when inductors are integrated, for example, in a low noise amplifier (LNA).

A conventional LNA includes a common-source structure or a cascode structure. In N multi-band transceivers, N LNAs in parallel are included (N being a natural number over 2). In particular, LNAs require characteristics of low noise and sufficient gain, thus requiring narrow band designs. Accordingly, more inductors are included in the transceivers as more frequency bands are required, and inductor circuit areas should be reduced.

SUMMARY OF THE INVENTION

An aspect of the present invention provides a multi-band low noise amplifier (LNA), including multiple low noise amplifying circuits configured to selectively operate in corresponding multiple frequency bands. The low noise amplifying circuits include corresponding multiple amplifying units and degenerating units. The degenerating units include corresponding multiple first inductors. The first inductors are arranged in loop patterns isolated from each other on a same layer, such that one first inductor surrounds at least one other first inductor of the multiple first inductors. A current flows through a selected first inductor included in a selected low noise amplifying circuit of the multiple noise amplifying circuits.

The loop patterns may have different sizes and centers that are substantially coincident. At least one of the first inductors may include at least two loops that cross each other at a crossing part.

Each amplifying unit may include a first transistor, an input impedance matching unit and a loading unit. The first transistor may include a first control terminal for receiving an input voltage through the input impedance matching unit, a first terminal connected to a power supply voltage through the loading unit, and a second terminal connected to a ground voltage through the degenerating unit corresponding to the amplifying unit. The amplifying unit may further include a second transistor that is cascode-connected to the first transistor, where the second transistor includes a third terminal connected to the loading unit and a second control terminal for receiving a bias voltage.

Each of the input impedance matching units of the amplifying units may include a second inductor. The second inductors in the input impedance matching units may be arranged in loop patterns isolated from each other on a same layer, such that one second inductor surrounds at least one other second inductor. A current flows through a selected second inductor included in the selected low noise amplifying circuit of the low noise amplifying circuits. Each of the loading units of the amplifying units may include a third inductor. The third inductors in the loading units may be arranged in loop patterns isolated from each other on a same layer, such that one third inductor surrounds at least one other third inductor. A current flows through a selected third inductor included in the selected low noise amplifying circuit of the low noise amplifying circuits.

Another aspect of the present invention provides multi-band radio frequency (RF) receiver, including an LNA having multiple low noise amplifying circuits configured to receive a wireless signal through an antenna and to selectively operate in corresponding multiple frequency bands. The low noise amplifying circuits include corresponding multiple amplifying units and first degenerating units. The first degenerating units include corresponding multiple first inductors, which are arranged in loop patterns isolated from each other on a same layer, such that one first inductor surrounds at least one other first inductor of the multiple first inductors. A current flows through a selected first inductor included in a selected low noise amplifying circuit of the multiple low noise amplifying circuits. The RF receiver further includes a multi-band down-mixing unit including multiple down-mixers. The down-mixers include corresponding multiple second degenerating units.

The loop patterns may have different sizes and centers that are substantially coincident. At least one of the first inductors may include at least two loops that cross each other at a crossing part.

The multiple second degenerating units may include corresponding multiple second inductors, arranged in loop patterns isolated from each other on a same layer, such that one second inductor surrounds at least one other second inductor of the multiple second inductors. A current may flow through a selected second inductor included in the selected low noise amplifying circuit of the multiple low noise amplifying circuits.

Each amplifying unit may include a first transistor, an input impedance matching unit and a loading unit. The first transistor may include a first control terminal for receiving an input voltage through the input impedance matching unit, a first terminal connected to a power supply voltage through the loading unit, and a second terminal connected to a ground voltage through the first degenerating unit corresponding to the amplifying unit.

Each amplifying unit may further include a second transistor that is cascode-connected to the first transistor, where the second transistor includes a third terminal connected to the loading unit and a second control terminal for receiving a bias voltage. Each of the input impedance matching units of the multiple amplifying units may include a third inductor. The third inductors in the input impedance matching units may be arranged in loop patterns isolated from each other on a same layer, such that one third inductor surrounds at least one other third inductor. A current may flow through a selected third inductor included in the selected low noise amplifying circuit of the multiple low noise amplifying circuits.

Each of the loading units of the multiple amplifying units may include a fourth inductor. The fourth inductors in the loading units may be arranged in loop patterns isolated from each other on a same layer, such that one fourth inductor surrounds at least one other fourth inductor. A current may flow through a selected fourth inductor included in the selected low noise amplifying circuit of the multiple low noise amplifying circuits.

The multi-band RF receiver may further include multiple Surface Acoustic Wave (SAW) filters connected between the low noise amplifying circuits and the down-mixers. The SAW filters may pass signals corresponding to the operating frequency band, the signals being amplified at the low noise amplifying circuits.

Yet another aspect of the present invention provides an integrated circuit (IC), including multiple circuits isolated with respect to one another. Each circuit includes an inductor pair formed in a loop pattern on a same layer as at least one other inductor pair from another circuit of the multiple circuits. The inductor pair surrounds and is isolated from the at least one other inductor pair.

A size of the loop pattern of the inductor pair may be different from a size of a loop pattern of the at least one other inductor pair. Also, a center of the loop pattern of the inductor pair may be substantially coincident with a center of the loop pattern of the at least one other inductor pair. The loop pattern of the inductor pair may include at least two loops that cross each other at a crossing part. The inductor pair and the at least one other inductor pair may be connected to a ground voltage at a common point in the corresponding loop patterns so that each of the inductor pairs is used as a differential pair of inductors.

BRIEF DESCRIPTION OF THE DRAWINGS

The embodiments of the present invention will be described with reference to the attached drawings, in which.

DESCRIPTION OF THE EMBODIMENTS

Figure 1:
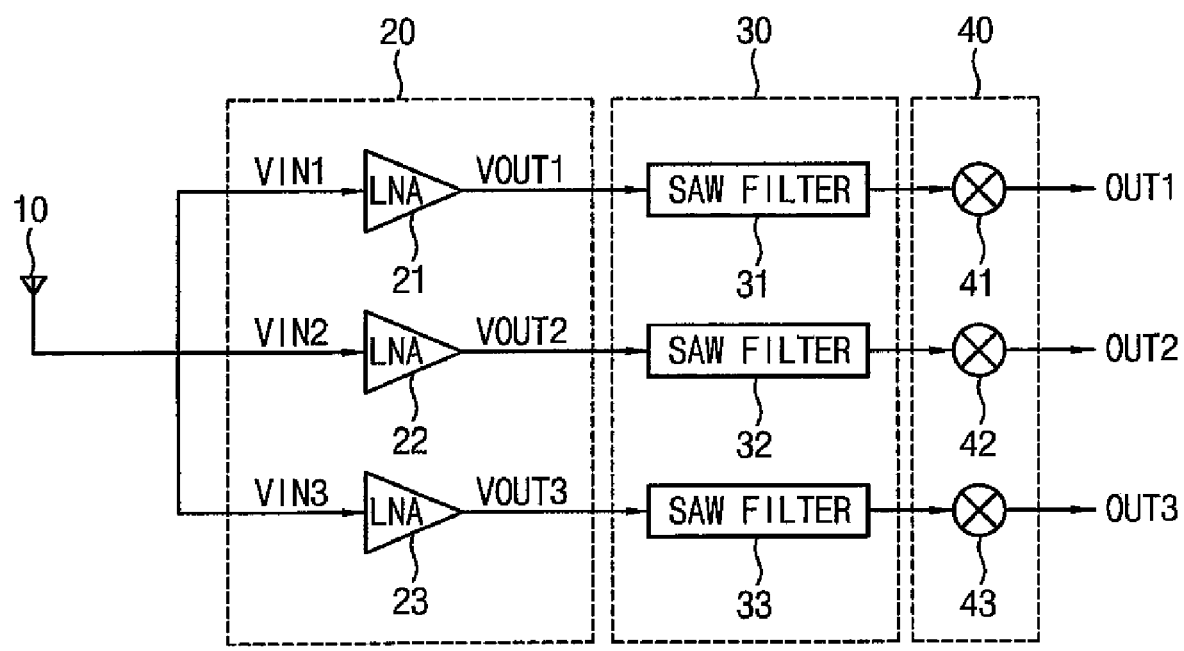
FIG. 1 is a block diagram illustrating a front-end of a radio frequency (RF) receiver, according to an exemplary embodiment of the present invention.

The present invention will now be described more fully with reference to the accompanying drawings, in which illustrative embodiments of the invention are shown. The invention may, however, may be embodied in various different forms, and should not be construed as being limited only to the illustrated embodiments. Rather, these embodiments are provided as examples, to convey the concept of the invention to one skilled in the art. Accordingly, known processes, elements, and techniques are not described with respect to some of the embodiments of the present invention. Throughout the drawings and written description, like reference numerals will be used to refer to like or similar elements.

It will be understood that, although the terms first, second, etc., may be used herein to describe various elements, these elements should not be limited by these terms. These terms are merely used to distinguish one element from another. For example, a first element could be termed a second element, and similarly, a second element could be termed a first element, without departing from the scope of the present invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a block diagram illustrating a front-end of a multi-band radio frequency (RF) receiver according to an exemplary embodiment of the present invention.

Referring to FIG. 1, the RF receiver includes an antenna 10, a multi-band low noise amplifier (LNA) 20, a Surface Acoustic Wave (SAW) filter 30, and a multi-band down-mixing unit 40.

For example, the multi-band RF receiver may support three frequency bands: 2110 through 2170 MHz, 1930 through 1990 MHz, and 869 through 900 MHz. A multi-band RF receiver supporting the three example frequency bands will be described below.

An RF signal received at the antenna 10 has a low level power due to the effects of noise and attenuation of the RF signal. The multi-band LNA 20 removes the noise and amplifies the RF signal. The multi-band LNA 20 may include a first low noise amplifying circuit 21, a second low noise amplifying circuit 22, and a third low noise amplifying circuit 23. The first low noise amplifying circuit 21 may selectively receive a first input signal VIN1, which is one of the RF signals provided through the antenna 10, in the first frequency band to output a first output signal VOUT1 by reducing the noise factor and amplifying the first input signal VIN1. The second low noise amplifying circuit 22 may selectively receive a second input signal VIN2, which is one of the RF signals provided through the antenna 10, in the second frequency band to output a second output signal VOUT2 by reducing the noise factor and amplifying the second input signal VIN2. The third low noise amplifying circuit 23 may selectively receive a third input signal VIN3, which is one of the RF signals provided from the antenna 10, in the third frequency band to output a third output signal VOUT3 by reducing the noise factor and amplifying the third input signal VIN3.

The SAW filter 30 may include a first SAW filter 31, a second SAW filter 32 and a third SAW filter 33. The first, second and third SAW filters 31, 32 and 33 respectively receive the first, second and third output signals VOUT1, VOUT2 and VOUT3 provided from the first, second and third low noise amplifying circuits 21, 22 and 23 to respectively pass signals in the desired frequency bands. The multi-band down-mixing unit 40 may include a first down-mixer 41, a second down-mixer 42 and a third down-mixer 43. The first, second and third down-mixers 41, 42 and 43 respectively down-mix signals provided from the first, second and third SAW filters 31, 32 and 33 to output first, second and third output signals OUT1, OUT2 and OUT3.

Figure 2:
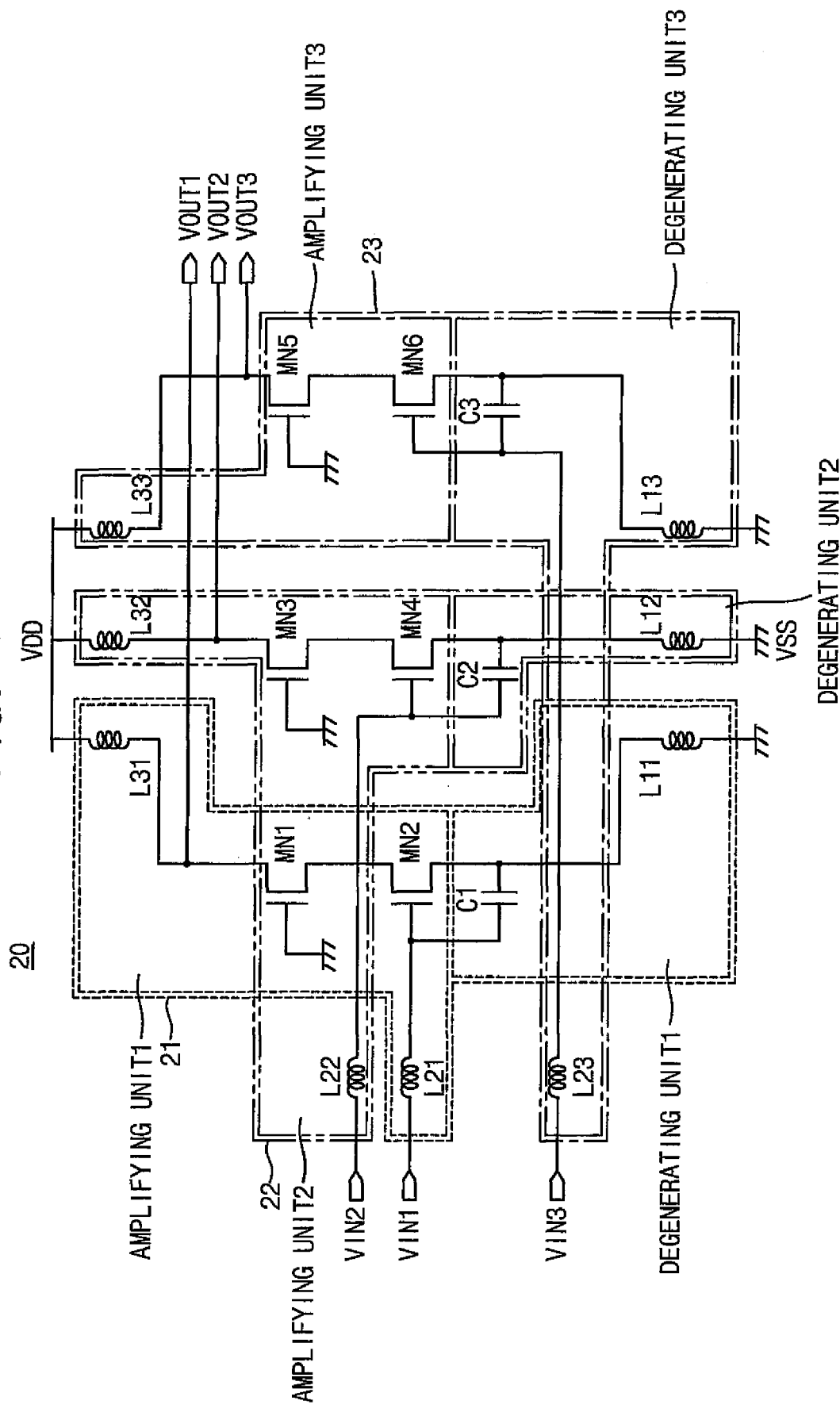
FIG. 2 is a circuit diagram illustrating a multi-band low-noise amplifier (LNA) in the RF receiver of FIG. 1, according to an exemplary embodiment of the present invention.

FIG. 2 is a circuit diagram illustrating a multi-band LNA in the RF receiver of FIG. 1, according to an exemplary embodiment of the present invention.

Referring to FIG. 2, the multi-band LNA 20 includes the first low noise amplifying circuit 21, the second low noise amplifying circuit 22 and the third low noise amplifying circuit 23.

The first low noise amplifying circuit 21 may include a first degenerating unit1 and a first amplifying unit1. The first degenerating unit1 may include a first inductor L11 and a first capacitor C1. The first amplifying unit1 includes first and second transistors, e.g., n-type metal oxide semiconductor (NMOS) transistors MN1 and MN2, that are cascode-connected to each other, a second inductor L21, and a third inductor L31. It is understood that types of transistors other than NMOS transistors may be used as the various transistors identified in the disclosed embodiments without departing from the spirit and scope of the present invention. The second inductor L21 operates as an impedance matching unit connected between a terminal receiving the first input signal VIN1 and a gate of the second NMOS transistor MN2. The third inductor L31 operates as a loading unit connected between a power supply voltage VDD and a drain of the first NMOS transistor MN1.

A gate of the first NMOS transistor MN1 may receive a direct current (DC) bias signal, and the gate of the first NMOS transistor MN1 may be in an alternating current (AC) grounded state through a coupling capacitor (not shown). For example, according to an embodiment of the present invention, the DC bias signal may be provided to the gate of the first NMOS transistor MN1. The coupling capacitor may isolate input and output terminals of the first NMOS transistor MN1, and increase an output impedance of the first NMOS transistor MN1. Thus, a signal that passes through the first NMOS transistor MN1 is well transmitted.

The first capacitor C1 is connected between the gate and a source of the second NMOS transistor MN2, and the first inductor L11 is connected between the source of the second NMOS transistor MN2 and a ground. The first degenerating unit1 may reduce the noise factor of the first input signal VIN1 according to an impedance of the first inductor L11.

The second low noise amplifying circuit 22 may include a second degenerating unit2 and a second amplifying unit 2. The second degenerating unit2 may include a fourth inductor L12 and a second capacitor C2. The second amplifying unit2 includes third and fourth NMOS transistors MN3 and MN4 that are cascode-connected to each other, a fifth inductor L22, and a sixth inductor L32. The fifth inductor L22 operates as the impedance matching unit connected between a terminal receiving the second input signal VIN2 and a gate of the fourth NMOS transistor MN4. The sixth inductor L32 operates as the loading unit connected between the power supply voltage VDD and a drain of the third NMOS transistor MN3.

A gate of the third NMOS transistor MN3 receives a DC bias signal, and the gate of the third NMOS transistor MN3 may be in an AC grounded state through a coupling capacitor (not shown). For example, according to an embodiment of the present invention, the DC bias signal may be provided to the gate of the third NMOS transistor MN3. The coupling capacitor may isolate input and output terminals of the third NMOS transistor MN3, and increase an output impedance of the third NMOS transistor MN3. Thus, a signal that passes through the third NMOS transistor MN3 is well transmitted.

The second capacitor C2 is connected between the gate and a source of the fourth NMOS transistor MN4, and the fourth inductor L12 is connected between the gate of the fourth NMOS transistor MN4 and the ground. The second degenerating unit2 may reduce the noise factor of the second input signal VIN2 according to an impedance of the fourth inductor L12.

The third low noise amplifying circuit 23 may include a third degenerating unit3 and a third amplifying unit3. The third degenerating unit3 may include a seventh inductor L13 and a third capacitor C3. The third amplifying unit3 includes fifth and sixth NMOS transistors MN5 and MN6 that are cascode-connected to each other, an eighth inductor L23, and a ninth inductor L33. The eighth inductor L23 operates as the impedance matching unit connected between a port receiving the third input signal VIN3 and a gate of the sixth NMOS transistor MN6. The ninth inductor L33 operates as the loading unit connected between the power supply voltage VDD and a drain of the fifth NMOS transistor MN5.

A gate of the fifth NMOS transistor MN5 receives a DC bias signal, and the gate of the fifth NMOS transistor MN5 may be in an AC grounded state through a coupling capacitor (not shown). For example, according to an embodiment of the present invention, the DC bias signal may be provided to the gate of the fifth NMOS transistor MN5. The coupling capacitor may isolate input and output terminals of the fifth NMOS transistor MN5, and increase an output impedance of the fifth NMOS transistor MN5. Thus, a signal that passes through the fifth NMOS transistor MN5 is well transmitted.

The third capacitor C3 is connected between the gate and a source of the sixth NMOS transistor MN6, and the seventh inductor L13 is connected between the gate of the sixth NMOS transistor MN6 and the ground. The third degenerating unit3 may reduce the noise factor of the third input signal VIN3 according to an impedance of the seventh inductor L13.

Relatively large circuit areas would be needed if the first through ninth inductors L11, L21, L31, L12, L22, L32, L13, L23, and L33 of the LNA were separately implemented on a chip. According to exemplary embodiments, the first, fourth and seventh inductors L11, L12 and L13 of the multi-band LNA may be arranged to be isolated from one another. For example, one of the first, fourth and seventh inductors L11, L12 and L13 may surround the other two inductors. Likewise, one of the second, fifth and eighth inductors L21, L22 and L23 may surround the other two inductors, and one of the third, sixth and ninth inductors L31, L32 and L33 may surround the other two inductors. Accordingly, a circuit area occupied by inductors may be reduced.

Figure 3:
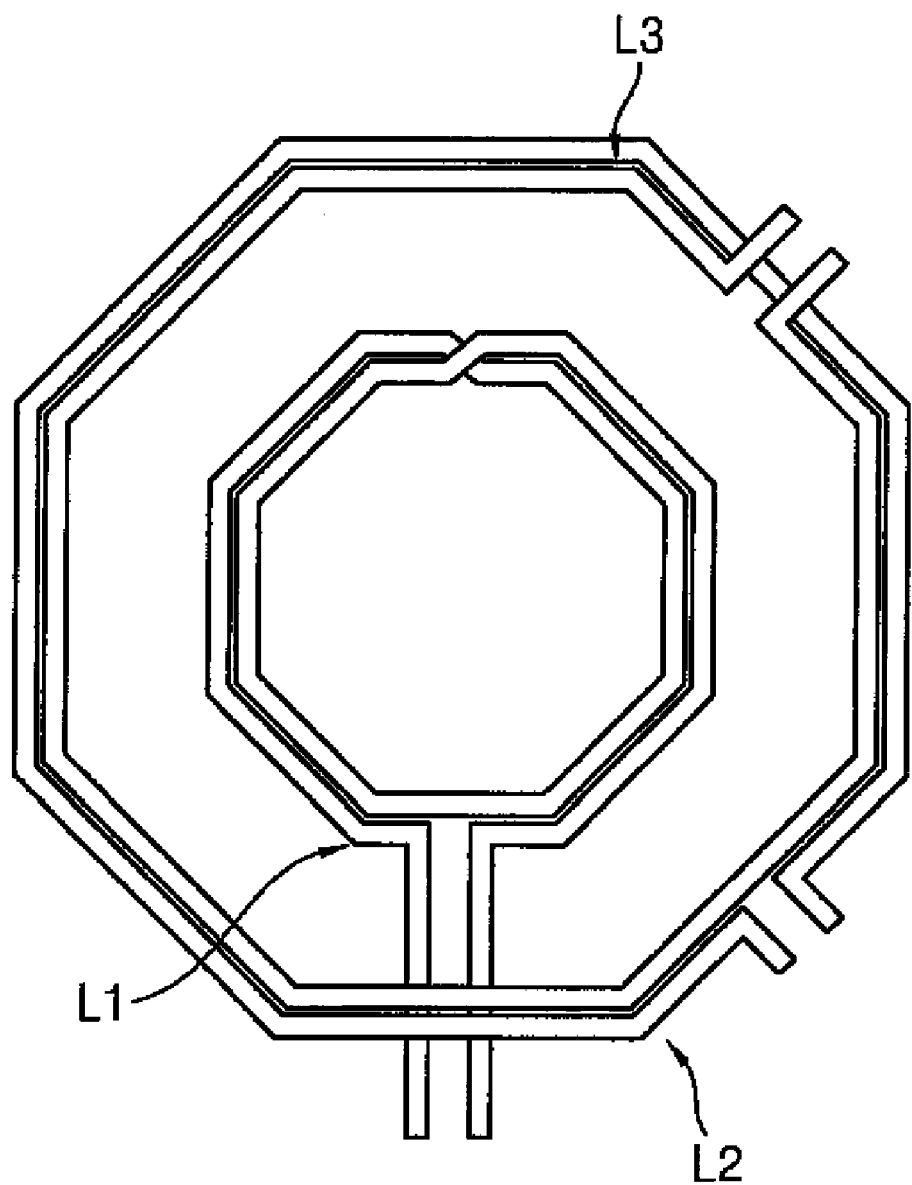
FIG. 3 is a plane view illustrating an arrangement of the inductors in FIG. 2, according to an exemplary embodiment of the present invention.

FIG. 3 is a plane view illustrating an arrangement structure of the sets of three inductors depicted in FIG. 2, according to an exemplary embodiment of the present invention.

Referring to FIG. 3, a set of first, second and third inductors L1, L2 and L3 may be formed on a same layer in loop patterns, such that first, second and third inductors L1, L2 and L3 are isolated from each other. The sizes of the inductor loop patterns may be different and the centers of the inductor loop patterns may be coincident. For example, the size of the loop pattern of the second inductor L2 may be larger than the size of the loop pattern of the third inductor L3, and the size of the loop pattern of the third inductor L3 may be larger than the size of the loop pattern of the first inductor L1. The first inductor L1, which has the smallest size, may include at least two loop patterns that cross each other at a crossing part. The loop patterns of the first, second and third inductors L1, L2 and L3 cross each other beneath the layer on which the first, second and third inductors L1, L2 and L3 are formed, and thus the first, second and third inductors L1, L2 and L3 may be isolated.

The inductors L1, L2 and L3 illustrated in FIG. 3 are depicted as having octagon loop patterns, in accordance with the exemplary embodiment. However, pattern shapes of the inductors may be unlimited in alternative embodiments. For example, the pattern of an inductor may be a hexagon and/or a circle, etc. Likewise, although the centers of the loop patterns of the inductors illustrated in FIG. 3 coincide, the present invention is not limited to this arrangement, and any structure enabling the sharing of area among the inductors may be used without departing from the spirit and scope of the present invention.

In the conventional stacked layer architecture, inductors formed in lower layers have poor quality factors and inductance characteristics. However, inductors formed on a same layer, according to an exemplary embodiment of the present invention, have similar characteristics, such as quality factor and inductance, to other inductors that are separately formed.

According to an exemplary embodiment of the present invention, patterns, sizes and a number of turning points of the inductors may be implemented in various styles according to desired quality factors and inductances. A current flows through only one of the inductors L1, L2 and L3 at a time. The other two inductors may then act as dummy metal, and thus characteristics, such as quality factors and inductances of the inductors, are stable.

Figure 4A:
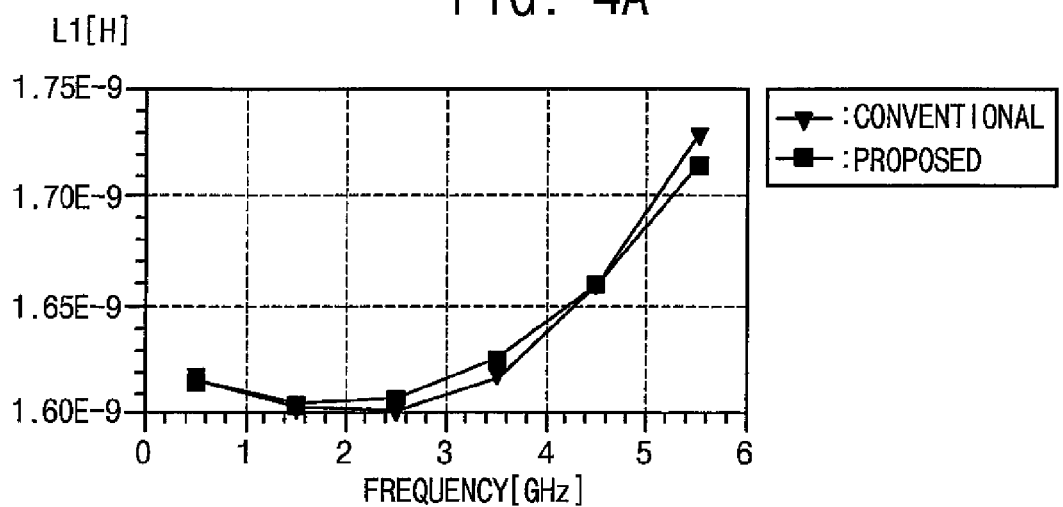
FIGS. 4A through 4C are graphs illustrating inductances of inductors, according to exemplary embodiments of the present invention.
Figure 4B:
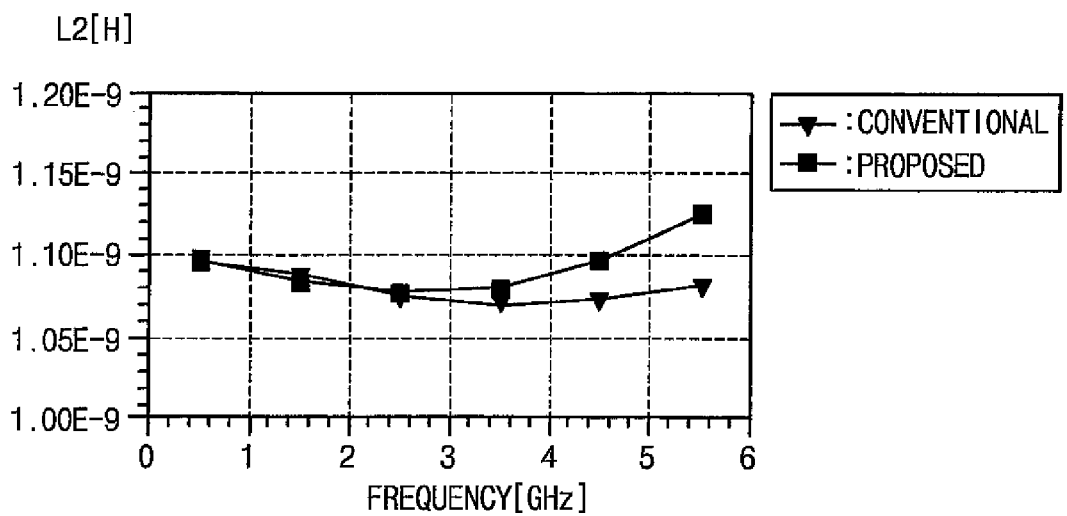
Figure 4C:
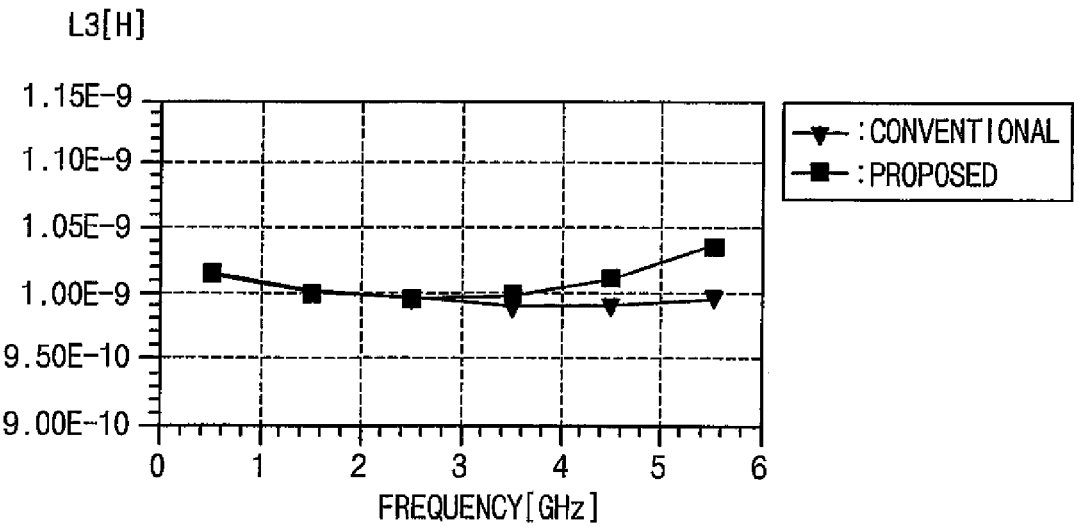

FIGS. 4A through 4C are graphs illustrating inductance relative to frequency of conventional inductors of LNAs in comparison to the proposed sets of inductors, according to embodiments of the present invention.

In FIGS. 4A through 4C, the x-axis represents frequency (unit: GHz) and the y-axis represents inductance (unit: H). As illustrated in FIGS. 4A through 4C, variations of inductances of the three inductors L1, L2 and L3 formed on the same layer, according to exemplary embodiments of the present invention, are similar to variations of inductances of three conventional inductors that are separately formed.

Figure 5A:
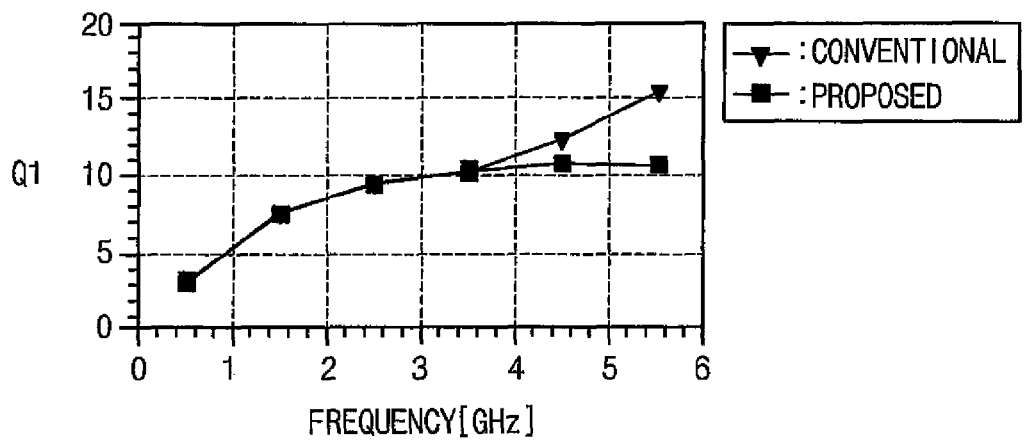
FIGS. 5A through 5C are graphs illustrating quality factors of LNAs, according to exemplary embodiments of the present invention.
Figure 5B:
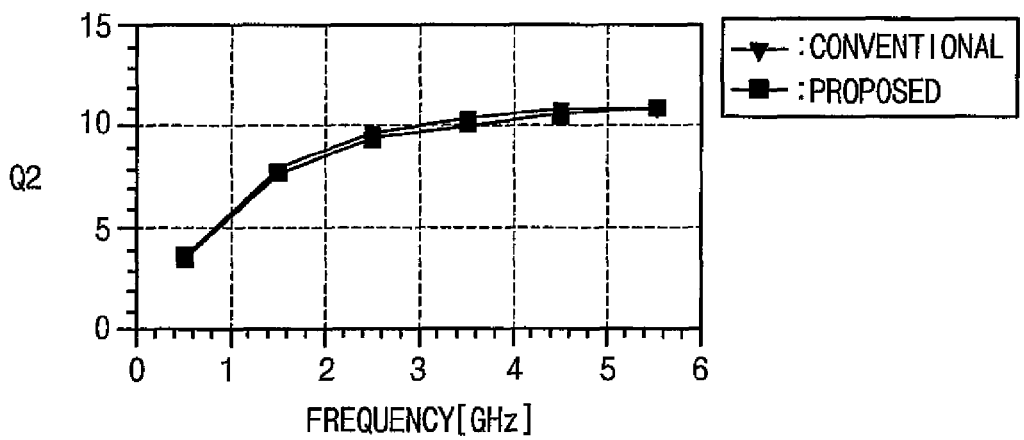
Figure 5C:
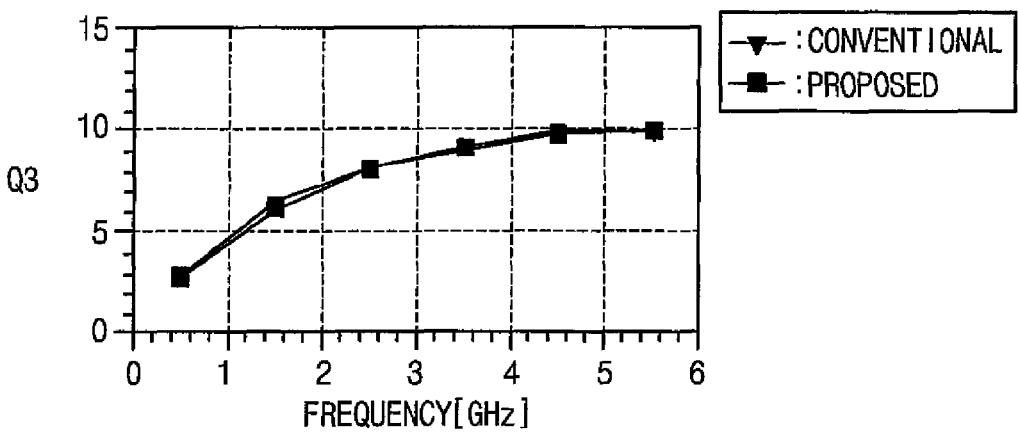

FIGS. 5A through 5C are graphs illustrating quality factors relative to frequency of conventional inductors of LNAs in comparison to the proposed sets of inductors, according to embodiments of the present invention.

In FIGS. 5A through 5C, the x-axis represents frequency (unit: GHz) and the y-axis represents a degree of a quality factor. As illustrated in FIGS. 5A through 5C, variations of quality factors of the three inductors L1, L2 and L3 formed on the same layer, according to exemplary embodiments of the present invention, are similar to variations of quality factors of three conventional inductors that are separately formed.

Figure 6:
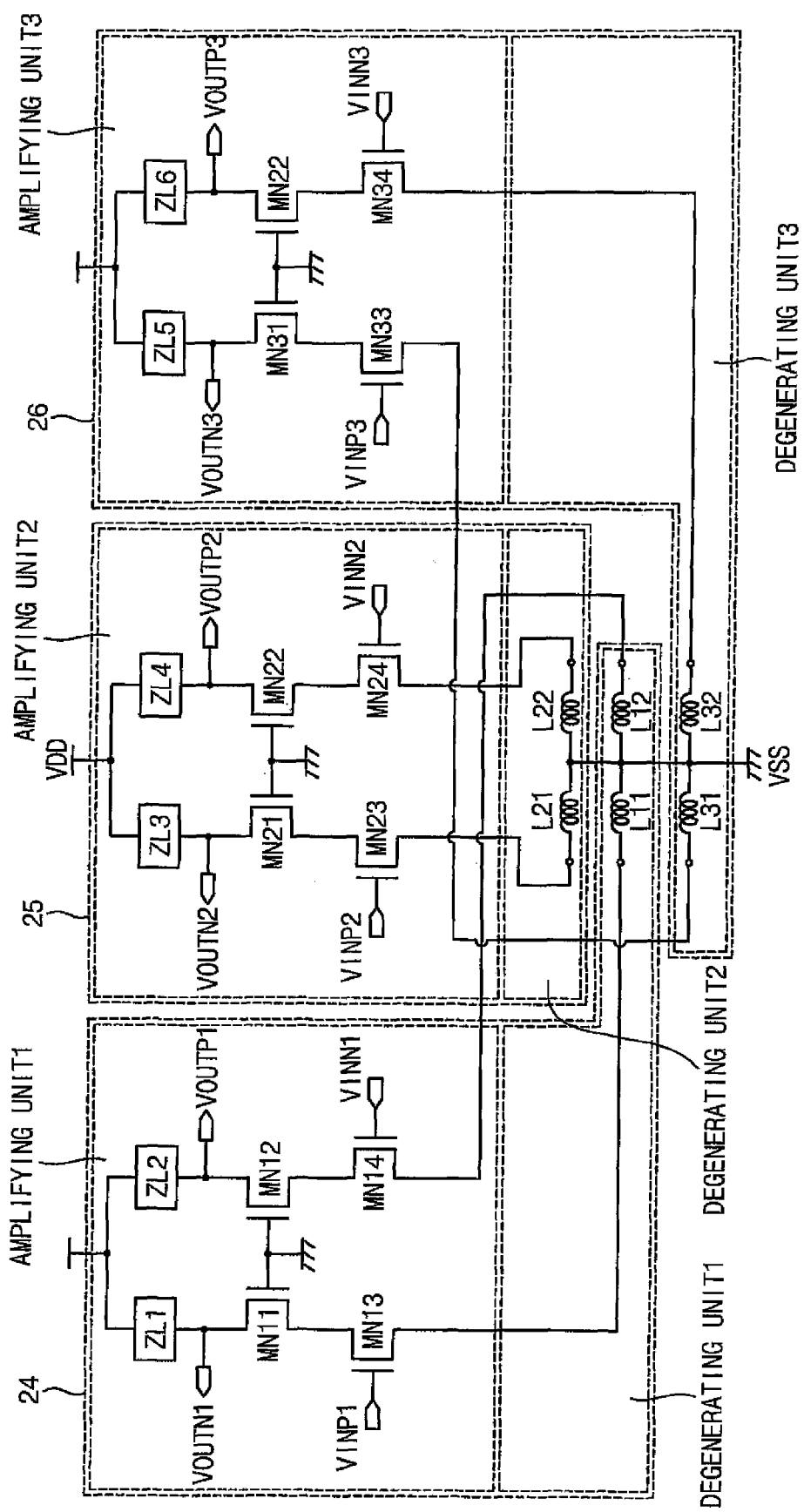
FIG. 6 is a circuit diagram illustrating a multi-band differential LNA, according to an exemplary embodiment of the present invention.

FIG. 6 is a circuit diagram illustrating a multi-band differential LNA, according to an exemplary embodiment of the present invention.

Referring to FIG. 6, the multi-band differential LNA includes first, second and third low noise amplifying circuits 24, 25 and 26. In alternative embodiments, the number of low noise amplifying circuits may differ depending on the number of required frequency bands.

The first low noise amplifying circuit 24 includes a first degenerating unit1 and a first amplifying unit1. The first degenerating unit1 may include a first inductor pair including a first inductor L11 and a second inductor L12, and the first amplifying unit1 may include first through fourth NMOS transistors MN11, MN12, MN13 and MN14, a first load ZL1 and a second load ZL2. The first and second inductors L11 and L12 correspond to a positive input terminal and a negative input terminal, respectively, of the degenerating unit1. Gates of the third and fourth NMOS transistors MN13 and MN14 are respectively connected to a differential input pair VINP1 and VINN1. Drains of the first and second NMOS transistors MN11 and MN12 are respectively connected to a differential output pair VOUT1 and VOUT2.

Gates of the first and second NMOS transistors MN11 and MN12 receive direct current (DC) bias signals, and may be in an alternating current (AC) grounded state through coupling capacitors (not shown). According to an exemplary embodiment of the present invention, the DC bias signal may be provided to the gates of the first and second NMOS transistors MN11 and MN12. The coupling capacitors isolate input and output terminals of the first and second NMOS transistors MN11 and MN12, and increase output impedances of the first and second NMOS transistors MN11 and MN12. Thus, signals that pass through the first and second NMOS transistors MN11 and MN12 are well transmitted.

The second low noise amplifying circuit 25 includes a second degenerating unit2 and a second amplifying unit2. The second degenerating unit2 may include a second inductor pair including a third inductor L21 and a fourth inductor L22, and the second amplifying unit2 may include fifth through eighth NMOS transistors MN21, MN22, MN23 and MN24, a third load ZL3 and a fourth load ZL4. The third and fourth inductors L21 and L22 correspond to a positive input terminal and a negative input terminal, respectively, of the degenerating unit2. Gates of the seventh and eighth NMOS transistors MN23 and MN24 are respectively connected to a differential input pair VINP2 and VINN2. Drains of the fifth and sixth NMOS transistors MN21 and MN22 are respectively connected to a differential output pair VOUT1 and VOUT2.

Gates of the fifth and sixth NMOS transistors MN21 and MN22 receive DC bias signals, and may be in an AC grounded state through coupling capacitors (not shown). According to an exemplary embodiment of the present invention, the DC bias signal may be provided to the gates of the fifth and sixth NMOS transistors MN21 and MN22. The coupling capacitors isolate input and output terminals of the fifth and sixth NMOS transistors MN21 and MN22, and increase output impedances of the fifth and sixth NMOS transistors MN21 and MN22. Thus, signals that pass through the fifth and sixth NMOS transistors MN21 and MN22 are well transmitted.

The third low noise amplifying circuit 26 includes a third degenerating unit3 and a third amplifying unit3. The third degenerating unit3 may include a third inductor pair including a fifth inductor L31 and a sixth inductor L32, and the third amplifying unit3 may include ninth through twelfth NMOS transistors MN31, MN32, MN33 and MN34, a fifth load ZL5 and a sixth load ZL6. The fifth and sixth inductors L31 and L32 correspond to a positive input terminal and a negative input terminal, respectively, of the degenerating unit3. Gates of the eleventh and twelfth NMOS transistors MN33 and MN34 are respectively connected to a differential input pair VINP3 and VINN3. Drains of the ninth and tenth NMOS transistors MN31 and MN32 are respectively connected to a differential output pair VOUT1 and VOUT2.

Gates of the ninth and tenth NMOS transistors MN31 and MN32 receive DC bias signals, and may be in an AC grounded state through coupling capacitors (not shown). According to an exemplary embodiment of the present invention, the DC bias signal may be provided to the gates of the ninth and tenth NMOS transistors MN31 and MN32. The coupling capacitors isolate input and output terminals of the ninth and tenth NMOS transistors MN31 and MN32, and increase output impedances of the ninth and tenth NMOS transistors MN31 and MN32. Thus, signals that pass through the ninth and tenth NMOS transistors MN31 and MN32 are well transmitted.

In a conventional LNA, if the first, second and third inductor pairs L11 and L12, L21 and L22 and L31 and L32 were separately implemented, the circuit area for the inductors would be increased. However, the first, second and third inductor pairs L11 and L12, L21 and L22, and L31 and L32 of the multi-band LNA, according to an exemplary embodiment of the present invention, are formed to be isolated on the same layer, such that a current flows through only one of the inductor pairs at a time. For example, one of the inductor pairs may surround the other inductor pairs, as depicted, for example, in FIG. 7. That is, the current flows through the pair included in the selected one of the low noise amplifying circuits, according to the multiple frequency bands.

Figure 7:
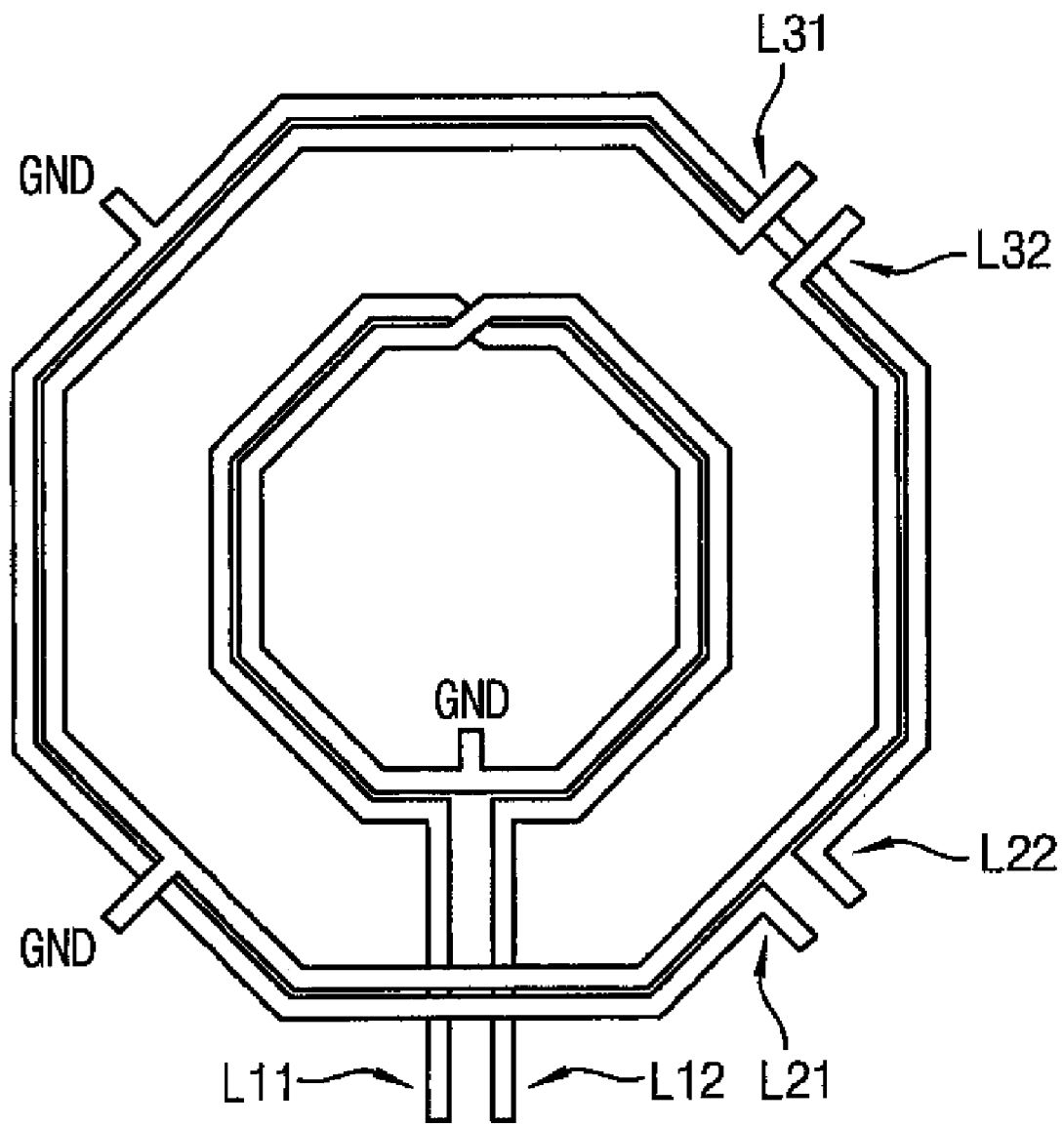
FIG. 7 is a plane view illustrating an arrangement of inductors in FIG. 6, according to an exemplary embodiment of the present invention.

FIG. 7 is a plane view illustrating an arrangement structure of the inductor pairs in FIG. 6, according to an exemplary embodiment of the present invention.

Referring to FIG. 7, the first through third inductor pairs L11 and L12, L21 and L22, and L31 and L32 may formed to be isolated on the same layer in loop patterns. The sizes of the loop patterns of the inductor pairs may be different, and the centers of the loop patterns may be coincident. For example, the size of the loop pattern of the second inductor pair L21 and L22 may be larger than the size of the loop pattern of the third inductor pair L31 and L32, and the size of the loop pattern of the third inductor pair L31 and L32 may be larger than the size of the loop pattern of the first inductor pair L11 and L12. The first inductor pair L11 and L12, which has the smallest size, may include at least two loop patterns that cross each other at a crossing part. The first, second and third inductor pairs L11 and L12, L21 and L22, and L31 and L32 cross each other beneath the layer on which the first, second and third inductor pairs L11 and L12, L21 and L22, and L31 and L32 are formed, such that the first through third inductor pairs L11 and L12, L21 and L22, and L31 and L32 may be isolated.

The inductor pairs illustrated in FIG. 7 are depicted as having octagon loop patterns, in accordance with the exemplary embodiment. However, pattern shapes of the inductor pairs may be unlimited in alternative embodiments. For example, the pattern of each inductor pair may be a hexagon and/or a circle, etc. Likewise, although the centers of the loop patterns of the inductor pairs illustrated in FIG. 7 are coincident, the present invention is not limited to this arrangement, and any structure enabling the sharing of area among the inductor pairs may be used without departing from the spirit and scope of the present invention.

According to an exemplary embodiment of the present invention, patterns, sizes and a number of turning points of the inductor pairs may be implemented in various manners according to desired quality factor and inductance. A current flows through only one of the inductor pairs L11 and L12, L21 and L22 or L31 and L32 at a time. The other two inductor pairs may then be regarded as dummy metal, and thus characteristics, such as quality factor and inductances of the inductors, are stable.

Figure 8:
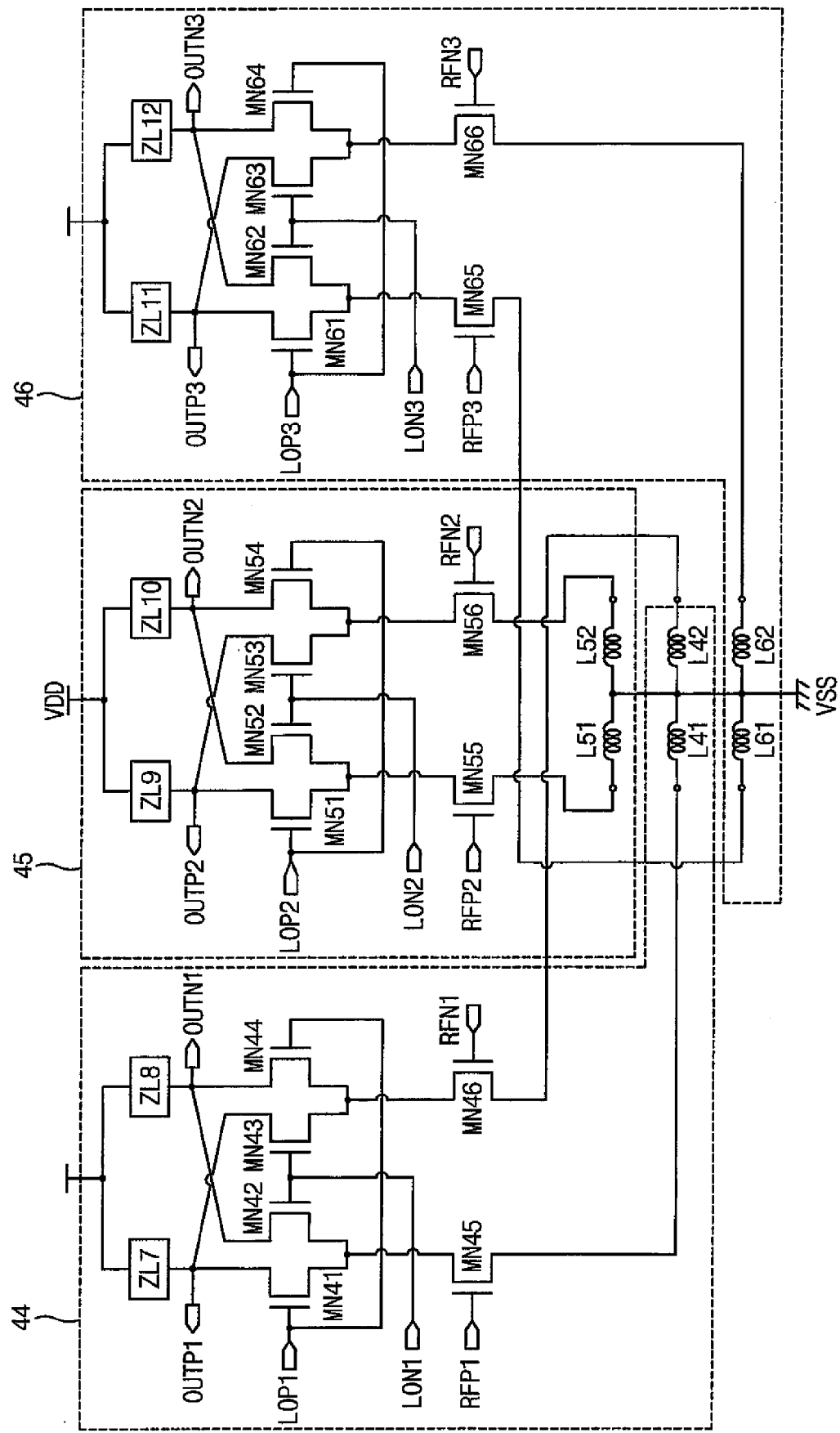
FIG. 8 is a circuit diagram illustrating a multi-band down-mixing unit according to an exemplary embodiment of the present invention.

FIG. 8 is a circuit diagram illustrating a multi-band down-mixing unit, according to an exemplary embodiment of the present invention.

Referring to FIG. 8, the multi-band down-mixing unit may include a first down-mixer 44, a second down-mixer 45 and a third down-mixer 46. The number of the down-mixers may vary depending on the number of required frequency bands.

The first down-mixer 44 includes a first inductor pair, including a first inductor L41 and a second inductor L42, first through sixth NMOS transistors MN41, MN42, MN43, MN44, MN45 and MN46, and first and second loads ZL7 and ZL8. Gates of the fifth and sixth NMOS transistors MN45 and MN46 respectively receive a first input pair RFP1 and RFN1. Gates of the first and fourth NMOS transistors MN41 and MN44 and gates of the second and third NMOS transistors MN42 and MN43 respectively receive a first local oscillation pair LOP1 and LON1. Drains of the first and third NMOS transistors MN41 and MN43, and drains of the second and fourth NMOS transistors MN42 and MN44 are respectively connected to a first output terminal pair OUTP1 and OUTN1.

The second down-mixer 45 includes a second inductor pair, including a third inductor L51 and a fourth inductor L52, seventh through twelfth NMOS transistors MN51, MN52, MN53, MN54, MN55 and MN56, and third and fourth loads ZL9 and ZL10. Gates of the eleventh and twelfth NMOS transistors MN55 and MN56 respectively receive a second input pair RFP2 and RFN2. Gates of the seventh and tenth NMOS transistors MN51 and MN54 and gates of the eighth and ninth NMOS transistors MN52 and MN53 respectively receive a second local oscillation pair LOP2 and LON2. Drains of the seventh and ninth NMOS transistors MN51 and MN53, and drains of the eighth and tenth NMOS transistors MN52 and MN54 are respectively connected to a second output terminal pair OUTP2 and OUTN2.

The third down-mixer 46 includes a third inductor pair, including a fifth inductor L61 and a sixth inductor L62, thirteenth through eighteenth NMOS transistors MN61, MN62, MN63, MN64, MN65 and MN66, and fifth and sixth loads ZL11 and ZL12. Gates of the seventeenth and eighteenth NMOS transistors MN65 and MN66 respectively receive a third input pair RFP3 and RFN3. Gates of the thirteenth and sixteenth NMOS transistors MN61 and MN64 and gates of the fourteenth and fifteenth NMOS transistors MN62 and MN63 respectively receive a third local oscillation pair LOP3 and LON3. Drains of the thirteenth and fifteenth NMOS transistors MN61 and MN63, and drains of the fourteenth and sixteenth NMOS transistors MN62 and MN64 are respectively connected to a third output terminal pair OUTP3 and OUTN3.

If the first through third inductor pairs L41 and L42, L51 and L52, L61 and L62 were separately implemented, the circuit area for the inductors would be relatively large. However, the first through third inductor pairs L41 and L42, L51 and L52, and L61 and L62 of the multi-band down-mixing unit, according to an exemplary embodiment of the present invention, are formed to be isolated on the same layer, such that current flows through the inductor pairs selected in response to the multiple frequency bands.

As mentioned above, the multi-band LNA and the multi-band RF receiver according to exemplary embodiments of the present invention reduce the area occupied by inductors by forming the inductors on the same layer. This enables the size of the chip area to be reduced. A current selectively flows through different inductors according to the multi-band frequencies. Accordingly, inductor characteristics, such as quality factor and inductances, of the inductors formed on the same layer, as described above, are similar to characteristics of the inductors separately formed on different layers.

Although the present invention has been described with reference to exemplary embodiments, it will be apparent to those skilled in the art that various modifications and changes may be made without departing from the spirit and scope of the present invention. Therefore, it should be understood that the above embodiments are not limiting, but illustrative in all aspects.

What is claimed is:

1. A multi-band low noise amplifier (LNA), comprising:
a plurality of low noise amplifying circuits configured to selectively operate in a corresponding plurality of frequency bands, the plurality of low noise amplifying circuits comprising a corresponding plurality of amplifying units and degenerating units, the plurality of degenerating units comprising a corresponding plurality of first inductors,
wherein the plurality of first inductors are arranged in a plurality of loop patterns isolated from each other on a same layer, such that one first inductor surrounds at least one other first inductor of the plurality of first inductors, and
wherein a current flows through a selected first inductor included in a selected low noise amplifying circuit of the plurality of low noise amplifying circuits.

2. The multi-band LNA of claim 1, wherein the plurality of loop patterns have a plurality of different sizes.

3. The multi-band LNA of claim 2, wherein centers of the plurality of loop patterns are substantially coincident.

4. The multi-band LNA of claim 3, wherein at least one of the first inductors comprises at least two loops that cross each other at a crossing part.

5. The multi-band LNA of claim 1, wherein each amplifying unit comprises a first transistor, an input impedance matching unit and a loading unit, and
wherein the first transistor comprises a first control terminal for receiving an input voltage through the input impedance matching unit, a first terminal connected to a power supply voltage through the loading unit, and a second terminal connected to a ground voltage through the degenerating unit corresponding to the amplifying unit.

6. The multi-band LNA of claim 5, wherein the amplifying unit further comprises a second transistor that is cascode-connected to the first transistor, the second transistor comprising a third terminal connected to the loading unit and a second control terminal for receiving a bias voltage.

7. The multi-band LNA of claim 6, wherein each of the input impedance matching units of the plurality of amplifying units comprises a second inductor, the second inductors in the input impedance matching units being arranged in a plurality of loop patterns isolated from each other on a same layer, such that one second inductor surrounds at least one other second inductor, and
wherein a current flows through a selected second inductor included in the selected low noise amplifying circuit of the plurality of low noise amplifying circuits.

8. The multi-band LNA of claim 6, wherein each of the loading units of the plurality of amplifying units comprises a third inductor, the third inductors in the loading units being arranged in a plurality of loop patterns isolated from each other on a same layer, such that one third inductor surrounds at least one other third inductor, and
wherein a current flows through a selected third inductor included in the selected low noise amplifying circuit of the plurality of low noise amplifying circuits.

9. A multi-band Radio Frequency (RF) receiver, comprising:
a multi-band low noise amplifier (LNA) comprising a plurality of low noise amplifying circuits configured to receive a wireless signal through an antenna and to selectively operate in a corresponding plurality of frequency bands, the plurality of low noise amplifying circuits comprising a corresponding plurality of amplifying units and first degenerating units, the plurality of first degenerating units comprising a corresponding plurality of first inductors are arranged in a plurality of loop patterns isolated from each other on a same layer, such that one first inductor surrounds at least one other first inductor of the plurality of first inductors, a current flowing through a selected first inductor included in a selected low noise amplifying circuit of the plurality of low noise amplifying circuits; and
a multi-band down-mixing unit comprising a plurality of down-mixers, the plurality of down-mixers comprising a corresponding plurality of second degenerating units.

10. The multi-band RF receiver of claim 9, wherein the plurality of loop patterns have a plurality of different sizes.

11. The multi-band RF receiver of claim 10, wherein centers of the plurality of loop patterns are substantially coincident.

12. The multi-band RF receiver of claim 11, wherein at least one of the first inductors comprises at least two loops that cross each other at a crossing part.

13. The multi-band RF receiver of claim 9, wherein the plurality of second degenerating units comprising a corresponding plurality of second inductors are arranged in a plurality of loop patterns isolated from each other on a same layer, such that one second inductor surrounds at least one other second inductor of the plurality of second inductors, a current flowing through a selected second inductor included in the selected low noise amplifying circuit of the plurality of low noise amplifying circuits.

14. The multi-band RF receiver of claim 9, wherein each amplifying unit comprises a first transistor, an input impedance matching unit, and a loading unit, and
wherein the first transistor comprises a first control terminal for receiving an input voltage through the input impedance matching unit, a first terminal connected to a power supply voltage through the loading unit, and a second terminal connected to a ground voltage through the first degenerating unit corresponding to the amplifying unit.

15. The multi-band RF receiver of claim 14, wherein each amplifying unit further comprises a second transistor that is cascode-connected to the first transistor, the second transistor comprising a third terminal connected to the loading unit and a second control terminal for receiving a bias voltage.

16. The multi-band RF receiver of claim 15, wherein each of the input impedance matching units of the plurality of amplifying units comprises a third inductor, the third inductors in the input impedance matching units being arranged in a plurality of loop patterns isolated from each other on a same layer, such that one third inductor surrounds at least one other third inductor, and
wherein a current flows through a selected third inductor included in the selected low noise amplifying circuit of the plurality of low noise amplifying circuits.

17. The multi-band RF receiver of claim 15, wherein each of the loading units of the plurality of amplifying units comprises a fourth inductor, the fourth inductors in the loading units being arranged in a plurality of loop patterns isolated from each other on a same layer, such that one fourth inductor surrounds at least one other fourth inductor, and
wherein a current flows through a selected fourth inductor included in the selected low noise amplifying circuit of the plurality of low noise amplifying circuits.

18. The multi-band RF receiver of claim 9, further comprising:
a plurality of Surface Acoustic Wave (SAW) filters connected between the plurality of low noise amplifying circuits and the plurality of down-mixers,
wherein the plurality of SAW filters passes signals corresponding to the operating frequency band, the signals being amplified at the low noise amplifying circuits.

* * * * *